United States Patent [19]
Tayebati

[11] Patent Number: 5,949,801
[45] Date of Patent: Sep. 7, 1999

[54] TUNABLE LASER AND METHOD FOR OPERATING THE SAME

[75] Inventor: Parviz Tayebati, Watertown, Mass.

[73] Assignee: CoreTek, Inc., Burlington, Mass.

[21] Appl. No.: 09/123,391

[22] Filed: Jul. 22, 1998

[51] Int. Cl.[6] ...................................................... H01S 3/10
[52] U.S. Cl. ................................ 372/20; 372/19; 372/106
[58] Field of Search ............................... 372/20, 19, 106, 372/98, 6

[56] References Cited

U.S. PATENT DOCUMENTS 5,450,427  9/1995  Fermann et al. ............................. 372/6
5,666,225  9/1997  Colbourne ................................. 372/20

Primary Examiner—Leon Scott, Jr.
Attorney, Agent, or Firm—Pandiscio & Pandiscio

[57] ABSTRACT

A tunable laser and method for operating the same, wherein the tunable laser utilizes a tunable Fabry-Perot filter as its wavelength-selective component. In one form of the invention, the tunable laser is characterized by the provision of optical elements (hereinafter referred to as "optical operators" or just "operators") on either side of the tunable Fabry-Perot filter, whereby the tunable Fabry-Perot filter can be set at a right angle to the optical path of the laser without introducing reflection problems interfering with the optimum lasing.

10 Claims, 6 Drawing Sheets

5,949,801

TUNABLE LASER AND METHOD FOR OPERATING THE SAME

FIELD OF THE INVENTION

This invention relates to lasers in general, and more particularly to tunable lasers.

BACKGROUND OF THE INVENTION

Controlling the spectral output of a laser through the use of a wavelength-selective component is well known in the art. Typically, a wavelength-selective component is positioned in optical communication with the optical gain region of the laser so as to select a specific wavelength from the output spectrum of the laser. Once an appropriate wavelength is selected, light of this wavelength is re-directed back into the laser's gain region so as to provide the positive feedback required for lasing action.

One type of wavelength-selective component is a tunable Fabry-Perot filter.

By way of example but not limitation, one such tunable Fabry-Perot filter is disclosed in U.S. Pat. No. 5,739,945, issued Apr. 14, 1998 to Parviz Tayebati for ELECTRICALLY TUNABLE OPTICAL FILTER UTILIZING A DEFORMABLE MULTI-LAYER MIRROR, which document is hereby incorporated herein by reference. By way of further example but not limitation, another such tunable Fabry-Perot filter is disclosed in U.S. patent application Ser. No. 09/059,877, filed Apr. 14, 1998 by Parviz Tayebati for ELECTRICALLY TUNABLE FABRY-PEROT STRUCTURE UTILIZING A DEFORMABLE MULTI-LAYER MIRROR AND METHOD OF MAKING THE SAME, which document is also incorporated herein by reference. By way of still further example but not limitation, another such tunable Fabry-Perot filter is disclosed in U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, which document is also hereby incorporated herein by reference.

Unfortunately, using a tunable Fabry-Perot filter as the wavelength-selective component of a tunable laser can introduce complications. For one thing, while the tunable Fabry-Perot filter can be placed in the laser's optical path so as to only pass light of a selected wavelength therethrough, which selected-wavelength light is subsequently re-directed back into the laser's gain region so as to provide the positive feedback required for lasing action, such tunable Fabry-Perot filters also generally reflect a substantial amount of the "rejected"-wavelength light back into the laser's gain region. This reflected, "rejected"-wavelength light can result in undesirable oscillations occurring within the laser and thereby interfere with optimum lasing.

In order to avoid such reflection problems, tunable Fabry-Perot filters are typically placed at an angle (i.e., at a non-perpendicular angle) to the laser's optical path. While such a configuration can reduce or eliminate the aforementioned reflection problems, it can also lead to other problems such as light loss problems, etc.

OBJECTS OF THE INVENTION

As a result, one object of the present invention is to provide a new tunable laser which is an improvement over the prior art.

Another object of the present invention is to provide a new tunable laser which uses a tunable Fabry-Perot filter as its wavelength-selective component and which is an improvement over the prior art.

And another object of the present invention is to provide a new method for operating a tunable laser.

SUMMARY OF THE INVENTION

These and other objects are addressed by the provision and use of a new tunable laser utilizing a tunable Fabry-Perot filter as its wavelength-selective component.

In one form of the invention, the tunable laser is characterized by the provision of optical elements (hereinafter referred to as "optical operators" or just "operators") on either side of the tunable Fabry-Perot filter, whereby the tunable Fabry-Perot filter can be set at a right angle to the optical path of the laser without introducing the reflection problems referred to above.

BRIEF DESCRIPTION OF THE DRAWINGS

These and other objects and features of the present invention are more fully disclosed or rendered obvious by the following detailed description of the preferred embodiments of the invention, which description is to be considered together with the accompanying drawings wherein.

DETAILED DESCRIPTION OF THE PREFERRED EMBODIMENTS

Figure 1:
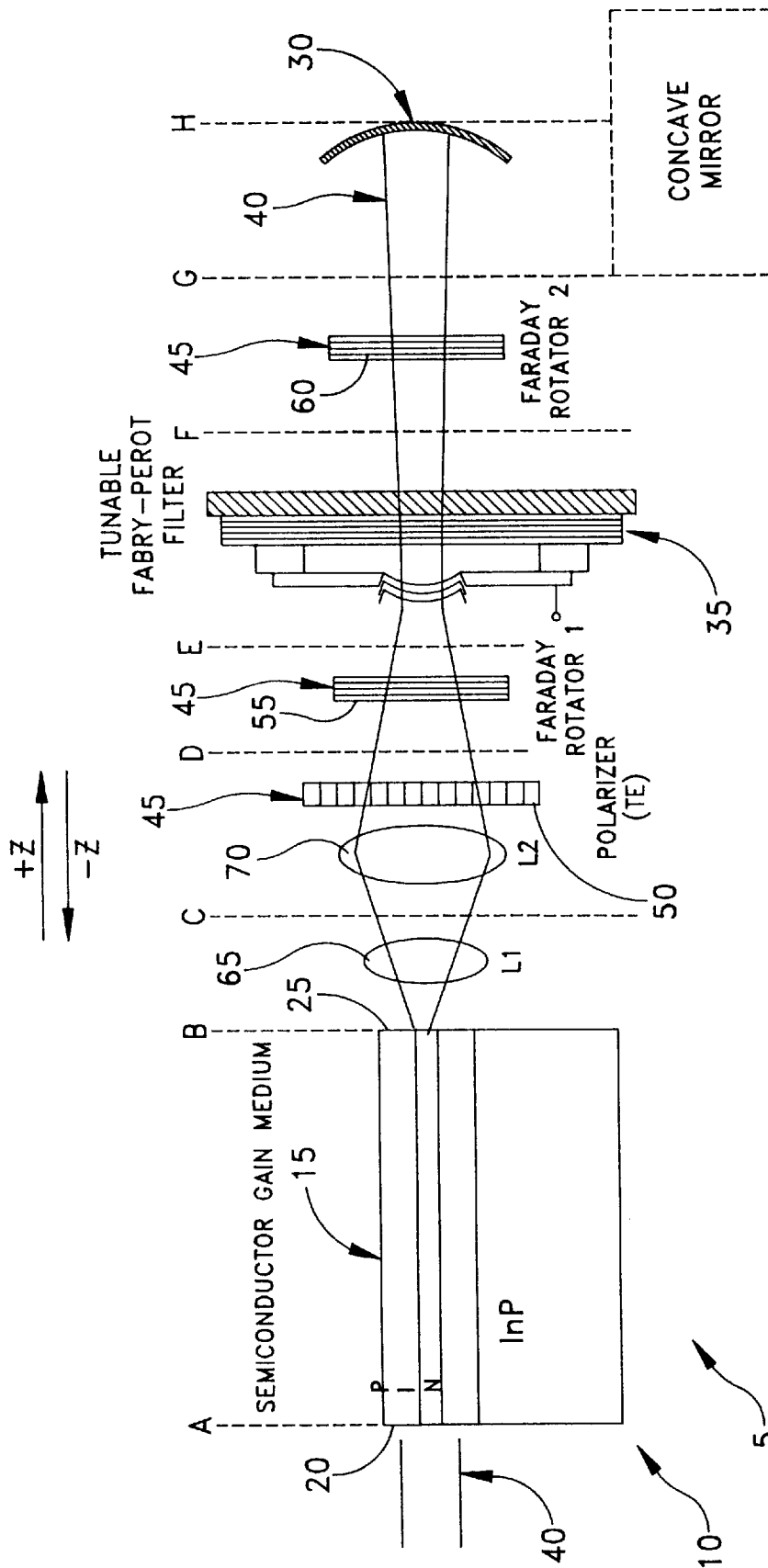
FIG. 1 is schematic diagram of one embodiment of the present invention.

Looking first at FIG. 1, there is shown a novel tunable laser 5 formed in accordance with the present invention.

Laser 5 generally comprises a gain medium 10 which preferably comprises a semiconductor optical amplifier (or "SOA") 15 having a relatively high reflectivity coated facet 20 and a relatively low reflectivity coated facet 25. Preferably semiconductor optical amplifier (or SOA) 15 comprises any type of epitaxially grown semiconductor gain medium such as InGaAsP/InP p-i-n quantum well structures, with the relatively high reflectivity coated facet 20 having a reflectivity $R_1$ greater than about 5%, and with the relatively low reflectivity coated facet 25 having a reflectivity $R_2 < 1/GR_1$, where G is the "round trip" net optical gain through the gain medium. As an example, G could be 40 dB (i.e., a factor of $10^4$ times gain) and $R_1$ could be 30%, resulting in $R_2 < 3 \times 10^{-4}$.

Relatively high reflectivity coated facet 20 forms one of the laser's two mirrors. A concave mirror 30, aligned with but spaced from relatively low reflectivity coated facet 25, forms the second of the laser's two mirrors. In practice, concave mirror 30 could be a lens which is high reflectivity coated on the side which acts as a curved mirror. Alternatively, a lens at an appropriate location in the cavity, in combination with a flat or curved mirror, can also be used.

In effect, relatively high reflectivity coated facet 20 and concave mirror 30 together define the laser's cavity.

A tunable Fabry-Perot filter 35 is disposed between relatively low reflectivity coated facet 25 and concave mirror 30. Tunable Fabry-Perot filter 35 can be any one of the tunable Fabry-Perot filters known in the art, whereby application of a voltage to the tunable Fabry-Perot filter will change its wavelength-selection properties. More particularly, as is known in the art, the application of a selected voltage to the tunable Fabry-Perot filter will cause the filter to pass a selected wavelength of light therethrough, while rejecting other wavelengths of light.

By way of example but not limitation, tunable Fabry-Perot filter 35 might comprise the tunable Fabry-Perot filter disclosed in the aforementioned U.S. Pat. No. 5,739,945, or it might comprise the tunable Fabry-Perot filter disclosed in the aforementioned U.S. patent application Ser. No. 09/059,877, or it might comprise the tunable Fabry-Perot filter disclosed in the aforementioned U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, all of which documents have been hereinabove incorporated herein by reference.

In accordance with the present invention, tunable Fabry-Perot filter 35 is disposed directly in the optical pathway 40 of laser 5, at a right angle to the optical pathway 40.

Figure 3:
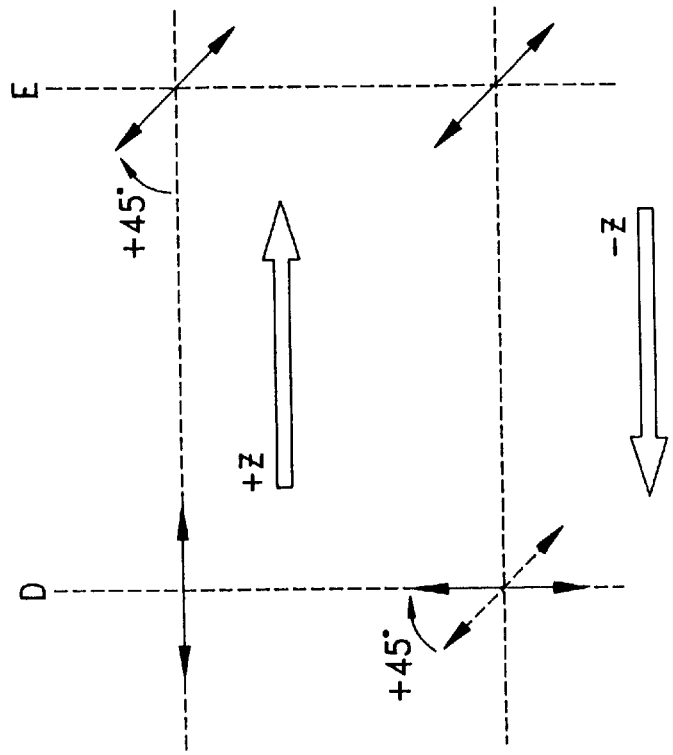
FIG. 3 is a schematic diagram showing how the "rejected"-wavelength light, i.e., the light reflected back toward the gain medium by the tunable Fabry-Perot filter, is polarized as that light passes through the laser.
Figure 2:
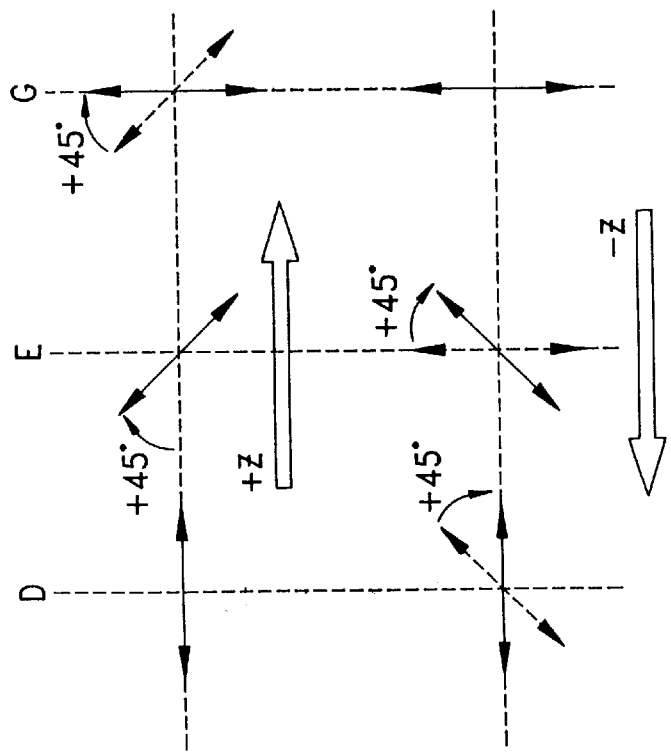
FIG. 2 is a schematic diagram showing how the selected-wavelength light, i.e., the light selected by the tunable Fabry-Perot filter, is polarized as that light passes through the laser.

Optical elements (hereinafter referred to as "optical operators" or just "operators") 45 are disposed on either side of tunable Fabry-Perot filter 35. Optical operators 45 are adapted to transform the light leaving relatively low reflectivity coated facet 25 of gain medium 10 so that (1) the wavelengths of light which are to be selected by tunable Fabry-Perot filter 35 can pass from gain medium 10 through tunable Fabry-Perot filter 35 to reach concave mirror 30 (defined as the "+Z" direction, as shown in FIG. 2), and then return off concave mirror 30 and pass back through tunable Fabry-Perot filter 35 so as to re-enter gain medium 10 (defined as the "–Z" direction, as shown in FIG. 2), and (2) any wavelengths of light reflected off tunable Fabry-Perot filter 35 back towards gain medium 10 (defined as the "–Z" direction, as shown in FIG. 3) will be prevented from re-entering gain medium 10.

In one embodiment of the present invention, optical operators 45 comprise (1) a polarizer 50 disposed between relatively low reflectivity facet 25 of gain medium 10 and tunable Fabry-Perot filter 35, (2) a first Faraday rotator 55 disposed between polarizer 50 and tunable Fabry-Perot filter 35, and (3) a second Faraday rotator 60 disposed between tunable Fabry-Perot filter 35 and concave mirror 30.

One or more lenses are provided between relatively low reflectivity coated facet 25 of gain medium 10 and polarizer 50 to transform and match the beam profile of the light exiting the gain medium to that of the tunable filter's mode shape. Preferably a first lens 65 and a second lens 70 are positioned between relatively low reflectivity coated facet 25 of gain medium 10 and polarizer 50, with first lens 65 being positioned adjacent to relatively low reflectivity coated facet 25 of gain medium 10, and second lens 70 being positioned adjacent to polarizer 50.

Tunable laser 5 operates as follows. The profile of the light emerging from relatively low reflectivity coated facet 25 of gain medium 10 is first circularized by first lens 65. Second lens 70 focuses this circularized light onto tunable Fabry-Perot filter 35. As the circularized light is passed from second lens 70 to tunable Fabry-Perot filter 35, the Light passes through polarizer 50 and first Faraday rotator 55 and is transformed.

More particularly, the polarization of the light emerging from gain medium 10 is, in general, randomly polarized or, in particular, mostly TE or TM mode polarized. Polarizer 50 allows the passage of light that is polarized along the polarizer's polar axis (P). An example of this is shown in FIGS. 1 and 2 (point D). This light then passes through first Faraday rotator 55, which rotates the polarization of the light by 45 degrees. See point E in FIGS. 1 and 2.

The light emerging from first Faraday rotator 55 then encounters tunable Fabry-Perot filter 35 whereupon, depending on the wavelength of the light, some of the light will pass through tunable Fabry-Perot filter 35 and some of the light will be reflected back toward gain medium 10 by tunable Fabry-Perot filter 35.

With respect to the light which is transmitted through tunable Fabry-Perot filter 35, this light will thereafter pass through second Faraday rotator 60, which rotates the state of the polarization of the light by another 45 degrees, resulting in an S polarization state (normal to P). See point G in FIGS. 1 and 2. This light then encounters concave mirror 30, which reflects the light back toward second Faraday rotator 60. As the light is reflected off concave mirror 30 and back toward second Faraday rotator 60, the concave mirror rotates the state of polarization of the light by another 180 degrees. The light then re-encounters second Faraday rotator 60, which rotates the state of the polarization of the light by another 45 degrees in the same direction, and then passes back through tunable Fabry-Perot filter 35. See point E in FIGS. 1 and 2. The light then re-encounters first Faraday rotator 55, which rotates the state of polarization of the light by another 45 degrees in the same direction. See point D in FIGS. 1 and 2. At this point, the returning light has the proper state of polarization to pass back through polarizer 50. As a result, the light emerging from polarizer 50 can return to gain medium 10 so as to allow the desired laser oscillation to occur, after another 180 degree polarization rotation by reflection off the cavity mirror at point A (i.e., the gain medium's relatively high reflectivity coated facet 20).

With respect to the light which is reflected back toward gain medium 10 by Fabry-Perot filter 35, this light undergoes changes in its polarization state as shown in FIG. 3. More particularly, as the light initially emerges from polarizer 50, it has the polarization state as shown at point D in FIG. 3. Thereafter, as the light passes through first Faraday rotator 55, it has the polarization state as shown at E in FIG. 3. When this light then encounters Fabry-Perot filter 35 and is reflected off, back toward gain medium 10, this light has its polarization state rotated by another 180 degrees. The reflected light then re-encounters first Faraday rotator 55, which rotates the state of polarization of the light by another 45 degrees in the same direction (with respect to the direction of propagation). See point D in FIG. 3. At this point, the light re-encounters polarizer 30. However, the light now has the wrong state of polarization to pass back through polarizer 50. Thus, the light reflected off Fabry-Perot filter 35 is prevented from returning to gain medium 10.

As noted above, in the absence of optical operators 45 (e.g., polarizer 50, first Faraday rotator 55 and second Faraday rotator 60), the strong reflections off tunable Fabry-Perot filter 35 will compete with the lasing mode of the laser as described above, i.e., the mode defined by the transmittance mode of tunable Fabry-Perot filter 35, thereby causing undesirable multi-mode laser oscillations. However, the provision of optical operators 45 (e.g., polarizer 50, first Faraday rotator 55 and second Faraday rotator 60) prevent such reflections off tunable Fabry-Perot filter 35 from returning to gain medium 10. As a result, the mode defined by the transmission wavelength of tunable Fabry-Perot filter 35 will oscillate efficiently in gain medium 10.

Figure 4:
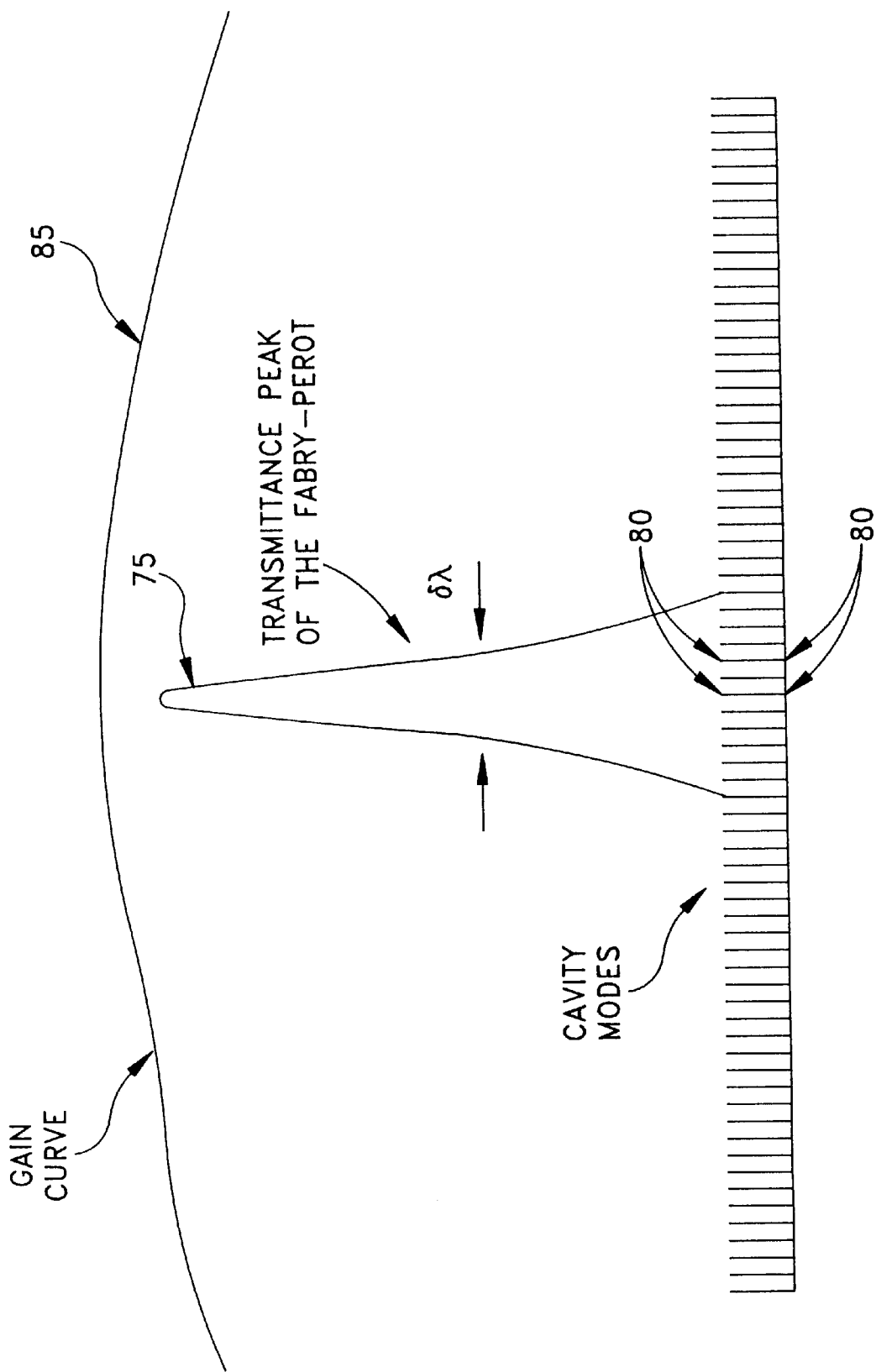
FIG. 4 is a schematic diagram illustrating the overlap between (1) the transmittance peak of the laser's tunable Fabry-Perot filter, and (2) the laser's cavity modes.

Looking next at FIG. 4, the laser's wavelength of oscillation is determined by the overlap of the transmittance peak 75 of tunable Fabry-Perot filter 35 and the cavity mode(s) 80 lying closest to this filter peak. The modes 80 of the laser's cavity are closely spaced. By tuning transmittance peak 75 of tunable Fabry-Perot filter 35, i.e., by adjusting the tuning voltage applied to tunable Fabry-Perot filter 35, the lasing mode will be tuned across the gain spectrum 85 of the laser's gain medium 10.

Standard laser theory shows that the modes that lie within the −0.04 dB (1% loss) bandwidth of the Fabry-Perot filter transmission peak may oscillate. Existence of more than one lasing mode can cause undesirable noise partition and is undesirable in many applications.

For a desired 2 cm cavity length, the cavity mode spacing is approximately 56 pm. The 3 dB half-width-half-maximum ("HWHM") bandwidth of a tunable Fabry-Perot filter (for example, that of the Fabry-Perot filter disclosed in the aforementioned U.S. patent application Ser. No. 09/105,399) is approximately 120 pm, or a 0.04 dB HWHM of 12 pm. As such, this laser will lase in a single longitudinal mode.

Unfortunately, however, lasers with much longer cavity lengths (e.g., 20–30 cm) can have more than one modes oscillating at the same time. For some applications this may not present a problem; however, for other applications such as wavelength division multiplexing ("WDM"), such multi-mode oscillation may be undesirable.

In order to design lasers with much longer cavity lengths (e.g., 20–30 cm) which do not suffer from such multi-mode oscillation, the linewidth of the tunable Fabry-Perot filter may be made narrower. This may be achieved by modifying the physical construction of the tunable Fabry-Perot filter so as to alter the profile of its transmittance peak 75.

Figure 5:
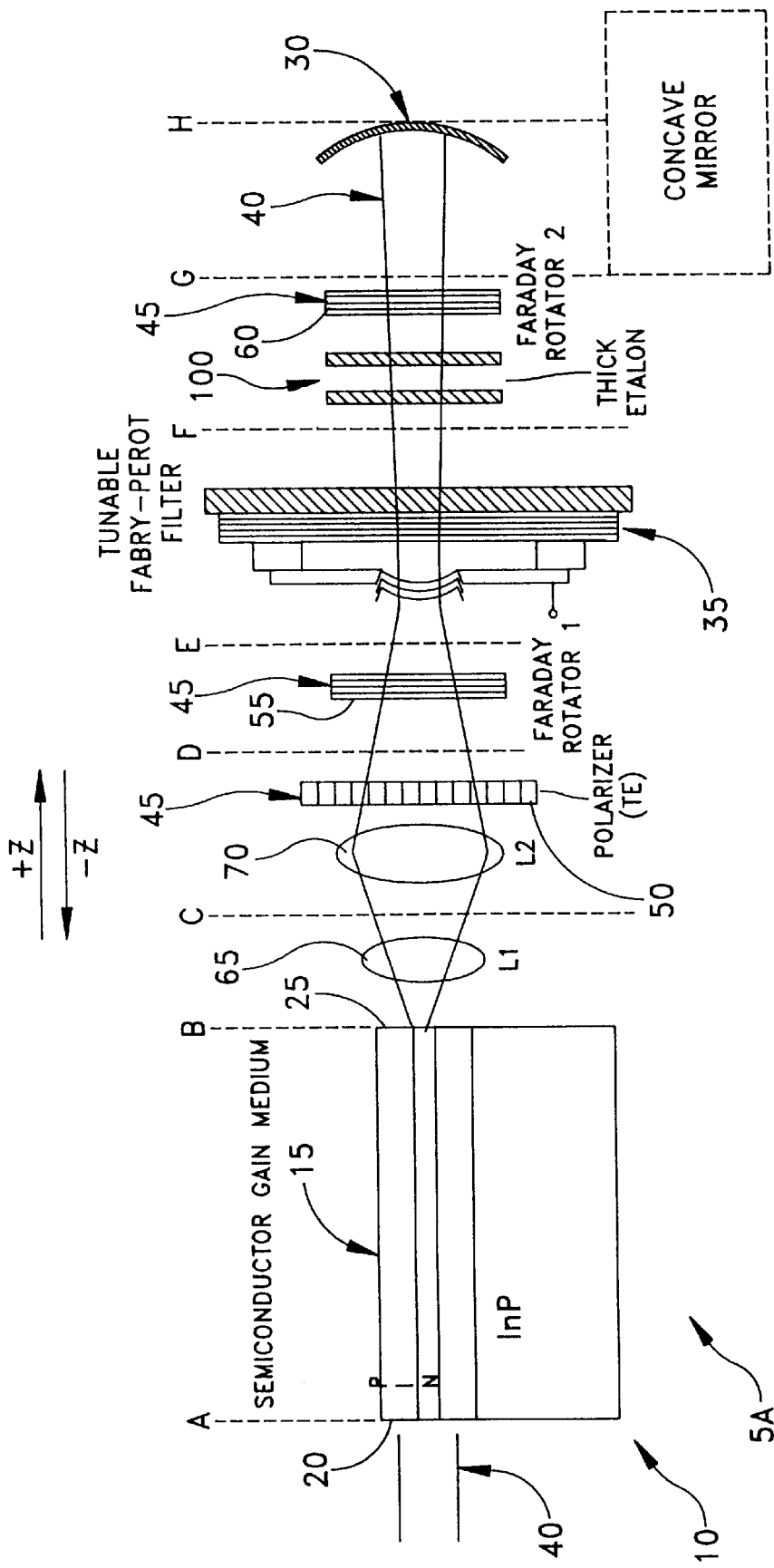
FIG. 5 is a schematic diagram illustrating a second embodiment of the present invention, in which a thick etalon is incorporated into the tunable laser downstream of the tunable Fabry-Perot filter.

Alternatively, in order to provide lasers with much longer cavity lengths (e.g., 20–30 cm) which do not suffer from such multi-mode oscillation, the design shown in FIG. 5 may be employed.

Figure 6:
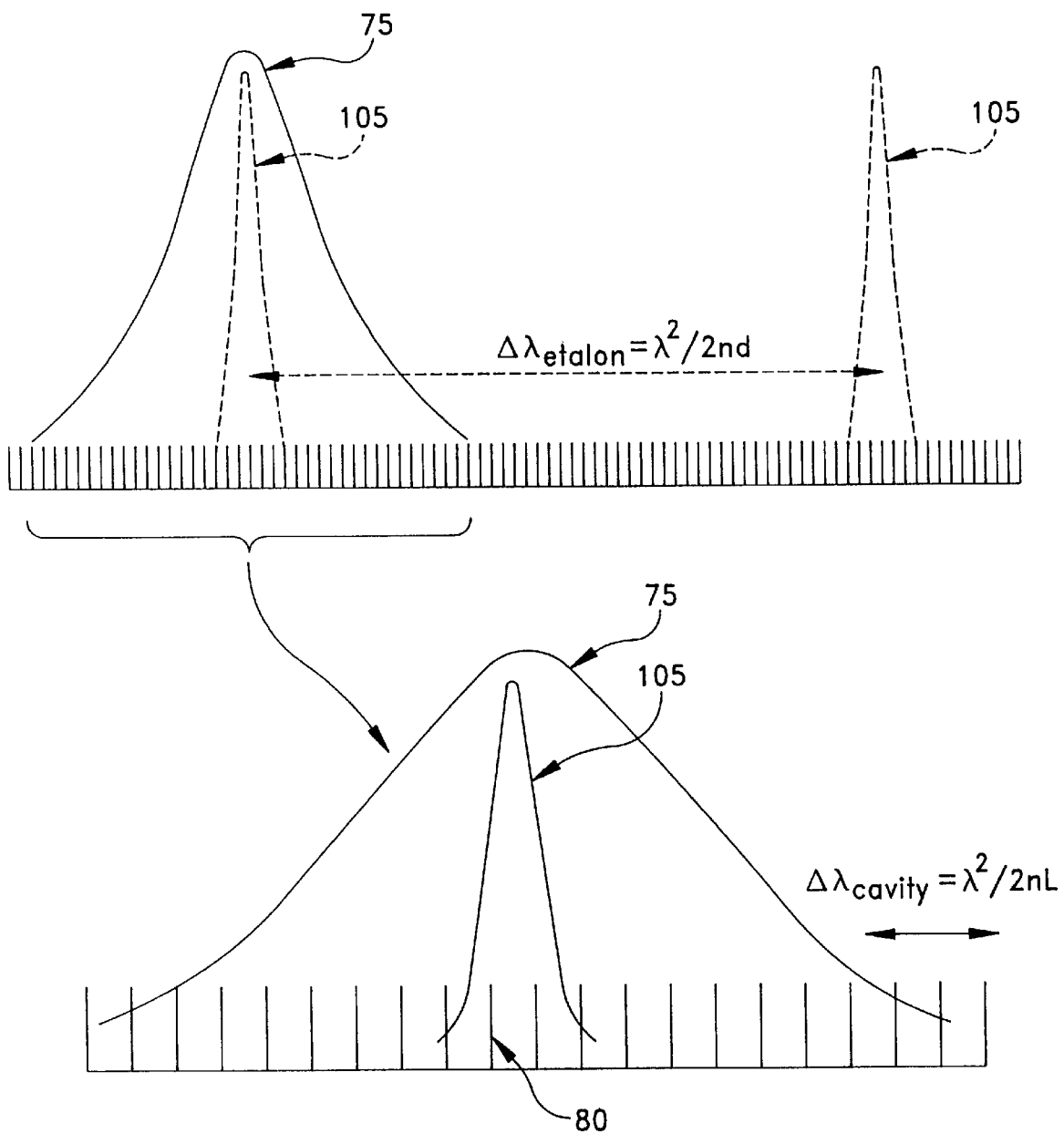
FIG. 6 is a schematic diagram illustrating the overlap between (1) the transmittance peak of the laser's tunable Fabry-Perot filter, (2) the transmittance peak of the laser's thick etalon, and (3) the laser's cavity modes.

More particularly, a novel tunable laser 5A is shown in FIG. 5. Tunable laser 5A is substantially the same as tunable laser 5 described above, except that a thick etalon 100 is positioned in the laser's cavity in the space between tunable Fabry-Perot filter 35 and second Faraday rotator 60. Thick etalon 100 further restricts oscillation of the more than one mode, as shown in FIG. 6. More particularly, lasing will occur only when the transmittance peak 75 of tunable Fabry-Perot 35 corresponds to the transmittance peak 105 of thick etalon 100 and one of the cavity modes 80.

In this respect it should be appreciated that the spacing, and position, of the modes 105 of thick etalon 100 can be designed so as to be approximately 25 GHz, 50 GHz or 100 GHz, as recommended by the ITU (International Telecommunication Union).

It should also be appreciated that, in addition to the above, thick etalon 100 is advantageous in defining precisely spaced WDM wavelengths even though the laser operates in a single mode (e.g., when the cavity length is short).

It should also be appreciated that mis-alignment between the transmittance peak 75 of tunable Fabry-Perot filter 35 and the transmittance peak 105 of thick etalon 100 may cause relatively high threshold and noisy operation. Such mis-alignment may be caused, for example, by changes in temperature in the laser 5A.

Figure 7:
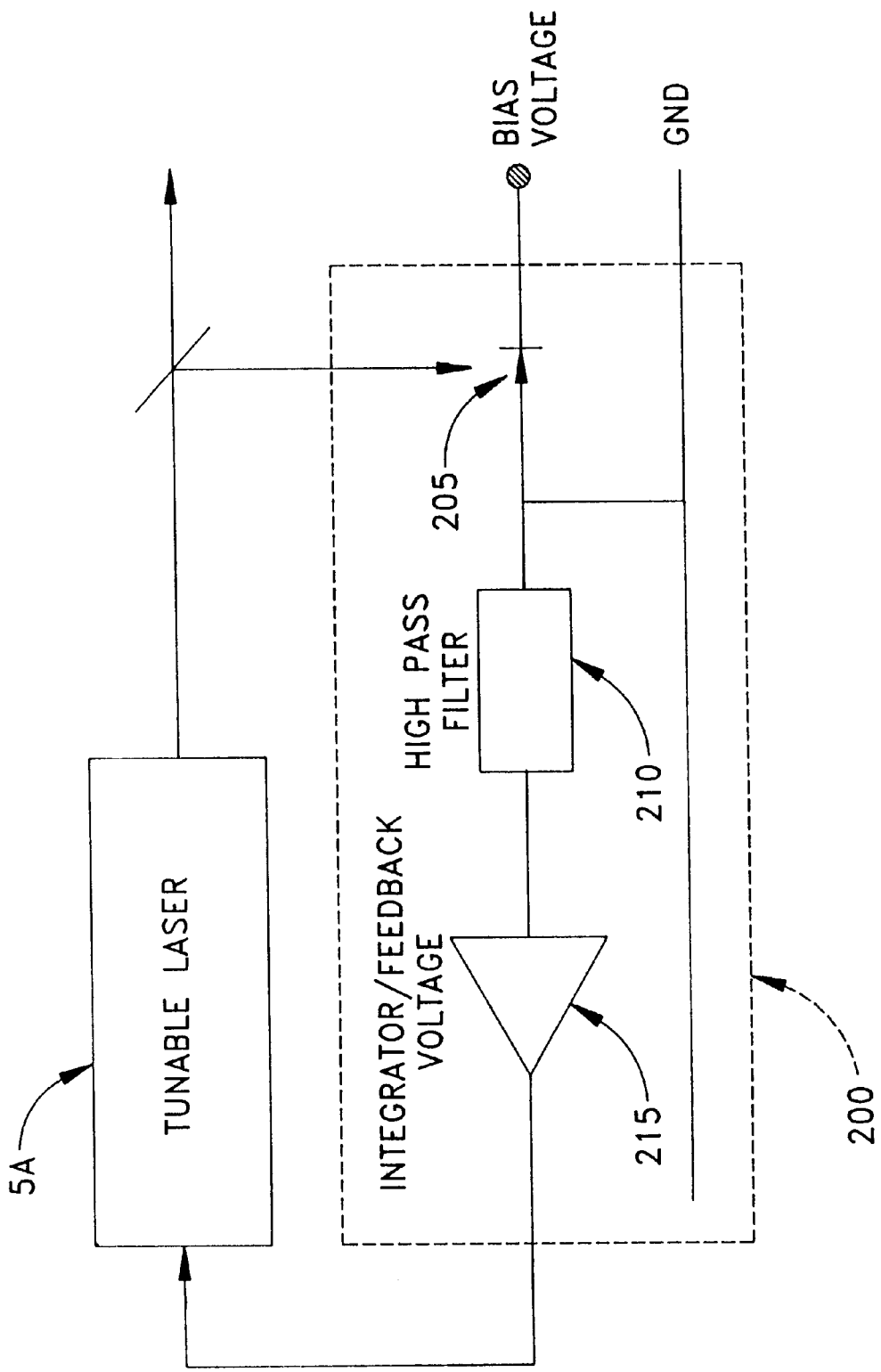
FIG. 7 is a schematic diagram illustrating a third embodiment of the present invention, in which an active feedback loop is incorporated into the tunable laser.

With this in mind, and looking now at FIG. 7, in order to bring the relative transmittance peaks of laser 5A into alignment, or in order to maintain the relative transmittance peaks of laser 5A in alignment, an active feedback loop 200 may be provided to optimize the wavelength of the tunable Fabry-Perot 35 for minimum noise. Active feedback loop 200 comprises a detector 205, a high pass frequency filter 210, and an integrator/feedback voltage generator 215. The active feedback loop 200 works as follows. The output of laser 5A is monitored for relative intensity noise by detector (and relevant circuitry) 205. The output of detector 205 is fed to high pass frequency filter 210, and the output of high pass frequency filter 210 is fed to the integrator/feedback voltage generator 215. Integrator/feedback voltage generator 215 is essentially a short time constant integrator which produces a measure of the average power density of the high frequency spectrum of the laser. The integrator/feedback voltage generator 215 provides an error signal which is proportional to the average high frequency power of the laser, which signal is then used as a negative feedback to tune Fabry-Perot filter 35 and thereby optimize the transmittance wavelength of the tunable filter for minimum noise.

It should be appreciated that active feedback loop 200 could also be used to compensate for the laser's cavity temperature so as to provide minimum relative intensity noise.

Alternatively, active feedback loop 200 could be designed so as to maximize the power level once the laser is locked to a particular mode.

Advantages Of The Present Invention

Numerous advantages are obtained through the use of the present invention.

For one thing, a new tunable laser is provided which is an improvement over the prior art.

And a new tunable laser is provided which uses a tunable Fabry-Perot filter as its wavelength-selective component and which is an improvement over the prior art.

And a new method is provided for operating a tunable laser.

What is claimed is:

1. A tunable laser comprising:

a gain medium defining a first relatively high reflectivity coated facet and a second relatively low reflectivity coated facet, said gain medium being adapted to generate a beam of light emerging from said second relatively low reflectivity coated facet;

a mirror disposed adjacent to, but spaced from, said second relatively low reflectivity coated facet and in alignment with said beam of light, said mirror having an appropriate curvature so as to define a stable laser cavity between said first relatively high reflectivity coated facet and said mirror;

a tunable Fabry-Perot filter disposed between said second relatively low reflectivity coated facet and said mirror, said tunable Fabry-Perot filter being disposed perpendicular to said beam of light;

lens apparatus disposed between said second relatively low reflectivity coated facet and said tunable Fabry-Perot filter, said lens apparatus being adapted to transform the intensity profile of the beam of light emerging from said gain medium so that the transformed profile of the beam of light emerging from said gain medium matches the lateral and transverse mode of said tunable Fabry-Perot filter; and optical operators disposed on either side of said tunable Fabry-Perot filter and in alignment with said beam of light, said optical operators being adapted to transform said beam of light emerging from said second relatively low reflectivity coated facet so that (1) the wavelengths of light which are to be selected by said tunable Fabry-Perot filter can pass from said gain medium through said tunable Fabry-Perot filter to reach said mirror, and then return off said mirror and pass back through said tunable Fabry-Perot filter to re-enter said gain medium 10, and (2) any wavelengths of light reflected off said tunable Fabry-Perot filter back towards said gain medium will be prevented from re-entering said gain medium.

2. A tunable laser according to claim 1 wherein said optical operators comprise:

is a polarizer disposed between said relatively low reflectivity coated facet and said tunable Fabry-Perot filter;

a first Faraday rotator disposed between said polarizer and said tunable Fabry-Perot filter; and a second Faraday rotator disposed between said tunable Fabry-Perot filter and said mirror.

3. A tunable laser according to claim 2 wherein said first Faraday rotator is adapted to rotate the state of polarization of light entering said first Faraday rotator by 45 degrees, and wherein said second Faraday rotator is adapted to rotate the state of polarization of light entering said second Faraday rotator by 45 degrees.

4. A tunable laser according to claim 2 wherein a thick etalon is disposed between said Fabry-Perot filter and said second Faraday rotator.

5. A tunable laser according to claim 4 wherein said thick etalon is designed to have a transmittance mode separated by integer multiples of 12.5 GHz.

6. A tunable laser according to claim 4 wherein said laser further comprises an active feedback loop adapted to monitor the output of the tunable laser and adjust the tuning voltage of said tunable Fabry-Perot filter so as to adjust the transmittance wavelength of said tunable Fabry-Perot filter so as to minimize noise.

7. A tunable laser according to claim 6 wherein said active feedback loop comprises a detector, a high pass frequency filter, and an integrator/feedback voltage generator.

8. A method for generating a laser beam of a selected wavelength, said method comprising the steps of:

proving a tunable laser comprising:

a gain medium defining a first relatively high reflectivity coated facet and a second relatively low reflectivity coated facet, said gain medium being adapted to generate a beam of light emerging from said second relatively low reflectivity coated facet;

a mirror disposed adjacent to, but spaced from, said second relatively low reflectivity coated facet and in alignment with said beam of light, said mirror having an appropriate curvature so as to define a stable laser cavity between said first relatively high reflectivity coated facet and said mirror;

a tunable Fabry-Perot filter disposed between said second relatively low reflectivity coated facet and said mirror, said tunable Fabry-Perot filter being disposed perpendicular to said beam of light;

lens apparatus disposed between said second relatively low reflectivity coated facet and said tunable Fabry-Perot filter, said lens apparatus being adapted to transform the intensity profile of the beam of light emerging from said gain medium so that the transformed profile of the beam of light emerging from said gain medium matches the lateral and transverse mode of said tunable Fabry-Perot filter; and optical operators disposed on either side of said tunable Fabry-Perot filter and in alignment with said beam of light, said optical operators being adapted to transform said beam of light emerging from said second relatively low reflectivity coated facet so that (1) the wavelengths of light which are to be selected by said tunable Fabry-Perot filter can pass from said gain medium through said tunable Fabry-Perot filter to reach said mirror, and then return off said mirror and pass back through said tunable Fabry-Perot filter to re-enter said grain medium, and (2) any wavelengths of light reflected off said tunable Fabry-Perot filter back towards said gain medium will be prevented from re-entering said gain medium; and tuning said tunable Fabry-Perot filter so as to set the transmittance mode of said tunable Fabry-Perot filter so as to vary the wavelength of laser oscillation.

9. A method according to claim 8 wherein said tunable laser further comprises a thick etalon disposed between said tunable Fabry-Perot filter and said mirror, and further wherein said tunable Fabry-Perot filter is tuned so that its transmittance peak matches the transmittance peak of said thick etalon.

10. A method according to claim 9 wherein said laser further comprises an active feedback loop adapted to monitor the output of the tunable laser and adjust the tuning voltage of said tunable Fabry-Perot filter so as to adjust the transmittance wavelength of said tunable Fabry-Perot filter so as to minimize noise.

* * * * *